(12) United States Patent
Kuo et al.

(10) Patent No.: US 8,816,715 B2
(45) Date of Patent: Aug. 26, 2014

(54) MOS TEST STRUCTURE, METHOD FOR FORMING MOS TEST STRUCTURE AND METHOD FOR PERFORMING WAFER ACCEPTANCE TEST

(75) Inventors: Chin-Te Kuo, New Taipei (TW); Yi-Nan Chen, Taipei (TW); Hsien-Wen Liu, Taoyuan County (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 278 days.

(21) Appl. No.: 13/105,913

(22) Filed: May 12, 2011

(65) Prior Publication Data
US 2012/0286819 A1　Nov. 15, 2012

(51) Int. Cl.
*G01R 31/02* (2006.01)
*G01R 31/26* (2014.01)
*H01L 21/66* (2006.01)
*G01R 31/28* (2006.01)

(52) U.S. Cl.
CPC ............ *H01L 22/34* (2013.01); *G01R 31/26* (2013.01); *G01R 31/02* (2013.01); *G01R 31/2831* (2013.01); *G01R 31/2644* (2013.01)
USPC ........... 324/762.05; 438/14; 438/15; 438/16; 438/17; 438/18; 257/48; 324/762.01; 324/762.09

(58) Field of Classification Search
CPC .......... G01R 26/2644; G01R 31/2644; G01R 31/2931; H01L 22/34
USPC .................... 324/762.05, 762.01, 762.09; 438/14–18; 257/48
See application file for complete search history.

(56) References Cited

U.S. PATENT DOCUMENTS

| | | | | |
|---|---|---|---|---|
| 4,581,578 A | * | 4/1986 | Honma et al. | 324/754.23 |
| 5,468,982 A | * | 11/1995 | Hshieh et al. | 257/331 |
| 5,981,971 A | * | 11/1999 | Miyakawa | 257/48 |
| 6,391,669 B1 | * | 5/2002 | Fasano et al. | 438/18 |
| 6,741,093 B2 | * | 5/2004 | Howland et al. | 324/754.03 |
| 7,075,140 B2 | * | 7/2006 | Spadea | 257/315 |
| 7,135,359 B2 | * | 11/2006 | Agarwal et al. | 438/133 |

(Continued)

FOREIGN PATENT DOCUMENTS

TW　　200937550　　9/2009

OTHER PUBLICATIONS

Hess et al., "Scribe Characterization Vehicle Test Chip for Ultra Fast Product Wafer Yield Monitoring", IEEE International Conference on Microelectronic Test Structures, 2006, p. 110-115.*

*Primary Examiner* — Patrick Assouad
*Assistant Examiner* — Lamarr Brown
(74) *Attorney, Agent, or Firm* — Winston Hsu; Scott Margo

(57) ABSTRACT

A MOS test structure is disclosed. A scribe line region is disposed on a substrate which has a first side and a second side opposite to the first side. An epitaxial layer is disposed on the first side, the doping well is disposed on the epitaxial layer and the doping region is disposed on the doping well. A trench gate of a first depth is disposed in the doping region, in the doping well and in the scribe line region. A conductive material fills the test via which has a second depth and an isolation covering the inner wall of the test via and is disposed in the doping region, in the doping well, in the epitaxial layer and in the scribe line region, to electrically connect to the epitaxial layer so that the test via is capable of testing the epitaxial layer and the substrate together.

15 Claims, 8 Drawing Sheets

(56) References Cited

U.S. PATENT DOCUMENTS

| | | | |
|---|---|---|---|
| 7,919,973 B2* | 4/2011 | Yach et al. | 324/750.3 |
| 2002/0031881 A1* | 3/2002 | Miyamoto et al. | 438/200 |
| 2002/0158649 A1* | 10/2002 | Chan et al. | 324/765 |
| 2003/0049872 A1* | 3/2003 | Look et al. | 438/14 |
| 2003/0146439 A1* | 8/2003 | Yamazaki et al. | 257/79 |
| 2004/0084671 A1* | 5/2004 | Song et al. | 257/48 |
| 2004/0262677 A1* | 12/2004 | Harada | 257/329 |
| 2005/0287683 A1* | 12/2005 | Hillard | 438/17 |
| 2007/0109003 A1* | 5/2007 | Shi et al. | 324/755 |
| 2008/0213972 A1* | 9/2008 | Disney et al. | 438/430 |
| 2009/0212794 A1* | 8/2009 | Chang et al. | 324/751 |
| 2011/0080185 A1* | 4/2011 | Wu et al. | 324/750.3 |
| 2011/0260747 A1* | 10/2011 | Kameda et al. | 324/762.01 |
| 2012/0153280 A1* | 6/2012 | Kim et al. | 257/48 |
| 2012/0199829 A1* | 8/2012 | Mayuzumi | 257/48 |
| 2012/0214262 A1* | 8/2012 | Yu et al. | 438/15 |
| 2013/0021107 A1* | 1/2013 | Poppe et al. | 331/57 |
| 2013/0032799 A1* | 2/2013 | Yen et al. | 257/48 |
| 2013/0057312 A1* | 3/2013 | Pagani | 324/762.01 |
| 2013/0130415 A1* | 5/2013 | Ahn et al. | 438/18 |
| 2013/0285694 A1* | 10/2013 | Graves-Abe et al. | 324/762.01 |

* cited by examiner

MOS TEST STRUCTURE, METHOD FOR FORMING MOS TEST STRUCTURE AND METHOD FOR PERFORMING WAFER ACCEPTANCE TEST

BACKGROUND OF THE INVENTION

1. Field of the Invention

The present invention generally relates to a MOS test structure, a method for forming a MOS test structure and a method for performing a wafer acceptance test (WAT). In particular, the present invention generally relates to a MOS test structure with a conductive material filling a test via, a method for forming the MOS test structure and a method for performing a wafer acceptance test (WAT) using the MOS test structure.

2. Description of the Prior Art

A trench gate MOS is one of the MOS structures used in semiconductor devices. To ensure manufacturing processes meet pre-determined standards, some electrical properties of the unfinished semiconductor devices have to be tested. For example, when a trench gate is formed in a doping well and in a doping region which are disposed on a substrate and on an epitaxial layer, a wafer acceptance test (WAT) should be carried out before a back side polishing from one side of a wafer.

If the wafer acceptance test (WAT) is directly carried out on the outmost doping well layer and the outmost substrate, the test result is an overall result of the doping well, the doping region, the epitaxial layer and the substrate. In other words, the test results of the epitaxial layer and the substrate cannot be obtained without the interference of the doping well and the doping region, which is not acceptable.

One test structure has been proposed to obtain the data of the epitaxial layer and the substrate without the interference of the doping well and the doping region. An additional heavily doped well is designed to be disposed adjacent to the doping well, the doping region, the epitaxial layer and the substrate, electrically connected to the doping well, the doping region, the epitaxial layer and the substrate, and in direct contact with the doping well, the doping region, the epitaxial layer and the substrate. A signal is applied on the drain side to pick up the signal from the heavily doped well to obtain the data of the epitaxial layer and the substrate without the interference of the doping well and the doping region. However, such additional heavily doped well is specially designed and occupies a considerable area. Also, the data is not completely independent of the interference by the doping well and the doping region since the additional heavily doped well is still electrically connected to the doping well and the doping region.

SUMMARY OF THE INVENTION

The present invention in a first aspect proposes a MOS test structure. In one aspect, the manufacturing processes of the MOS test structure are compatible with the current manufacturing processes of the MOS structure. In a second aspect, the MOS test structure of the present invention is able to be completely independent of interference from the adjacent doping well and the doping region. In a third aspect, the MOS test structure of the present invention does not have to occupy a considerable area on the MOS structure.

The MOS test structure of the present invention includes a substrate, a scribe line region, an epitaxial layer, a doping well, a doping region, a trench gate, a test via, an isolation and a conductive material. The scribe line region is disposed on the substrate which is of a first conductivity type and has a first side and a second side opposite to the first side. The epitaxial layer of the first conductivity type is disposed on the first side, the doping well of a second conductivity type is disposed on the epitaxial layer, and the doping region of the first conductivity type is disposed on the doping well. The trench gate of a first depth is disposed in the doping region, in the doping well and in the scribe line region. The conductive material fills the test via, which has a second depth, and an isolation covering the inner wall of the test via and is disposed in the doping region, in the doping well, in the epitaxial layer and in the scribe line region, to electrically connect to the epitaxial layer so that the test via is capable of testing the epitaxial layer and the substrate together.

In one embodiment of the present invention, the epitaxial layer completely covers the substrate.

In another embodiment of the present invention, the doping well completely covers the epitaxial layer.

In another embodiment of the present invention, the doping region completely covers the doping well.

In another embodiment of the present invention, the trench gate and the test via have a substantially same width.

In another embodiment of the present invention, the second depth is greater than the first depth.

In another embodiment of the present invention, the conductive material is doped polysilicon.

The present invention in a second aspect proposes a method for forming a MOS test structure. First, a substrate, a scribe line region, an epitaxial layer, a doping region and a doping well are provided. The substrate has a first conductivity type, a first side and a second side opposite to the first side. The scribe line region is disposed on the substrate, the epitaxial layer of the first conductivity type is disposed on the first side, the doping well of a second conductivity type is disposed on the epitaxial layer, and the doping region of the first conductivity type is disposed on the doping well. Second, an etching step is carried out to form a gate trench and a test via which both penetrate the doping region and the doping well. Later, an oxidizing step is carried out to simultaneously form a gate isolation covering the inner wall of the gate trench and to form an isolation covering the inner wall of the test via. Then, a back-etching step is carried out to exclusively remove the isolation disposed on the bottom of the test via. Next, a penetrating step is carried out to deepen the test via for penetrating into the epitaxial layer. Then, the test via and the gate trench are filled with a conductive material to form a trench gate and a test structure. The conductive material is electrically connected to the epitaxial layer so that the test structure is capable of testing the epitaxial layer and the substrate together.

In one embodiment of the present invention, the trench gate and the test via have a substantially same width.

The present invention in a third aspect proposes a method for performing a wafer acceptance test (WAT). First, a MOS test structure is provided. The MOS test structure includes a substrate, a scribe line region, an epitaxial layer, a doping well, a doping region, a trench gate, a test via, an isolation and a conductive material. The scribe line region is disposed on the substrate which is of a first conductivity type and has a first side and a second side opposite to the first side. The epitaxial layer of the first conductivity type is disposed on the first side, the doping well of a second conductivity type is disposed on the epitaxial layer and the doping region of the first conductivity type is disposed on the doping well. The trench gate of a first depth is disposed in the doping region, in the doping well and in the scribe line region. The conductive material fills the test via which has a second depth and an isolation covering the inner wall of the test via and is disposed in the doping region, in the doping well, in the epitaxial layer and in the scribe line region, to electrically connect to the epitaxial layer so that the test via is capable of testing the epitaxial layer and the substrate together. Second, a signal is applied on the second side. Then, the signal is measured from the conductive material which fills the test via in the absence of the influence of the doping region and the doping well due to the presence of the isolation.

In one embodiment of the present invention, the epitaxial layer completely covers the substrate.

In another embodiment of the present invention, the signal is an electric signal.

In another embodiment of the present invention, the trench gate and the test via have a substantially same width.

In another embodiment of the present invention, the second depth is greater than the first depth.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
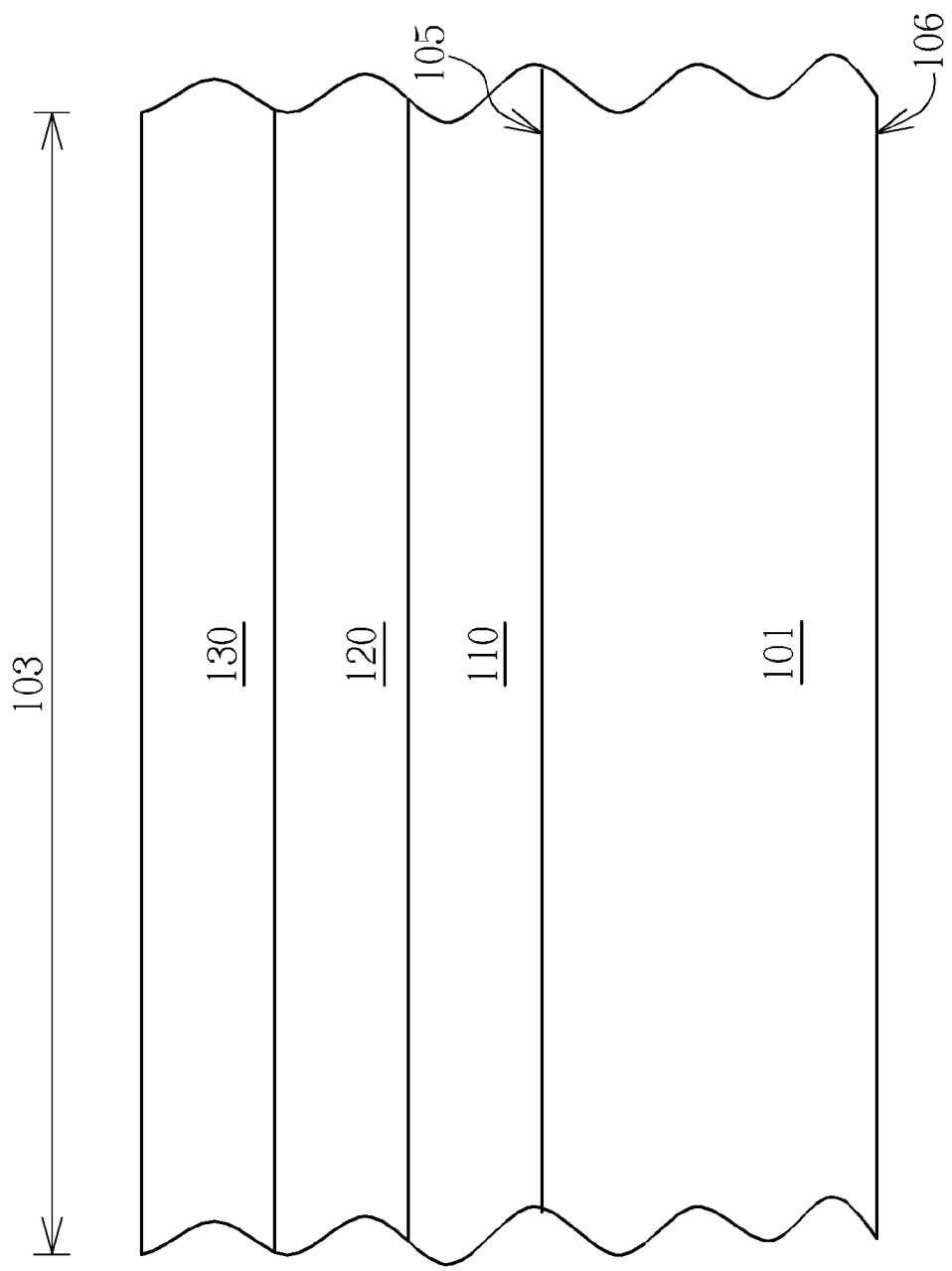
FIGS. 1-5 illustrate a method for forming a MOS test structure of the present invention.

The present invention in a first aspect provides a method for forming a MOS test structure. Please refer to FIGS. 1-7, which illustrate the method for forming a MOS test structure of the present invention. First, as shown in FIG. 1, a substrate 101, a scribe line region 103, an epitaxial layer 110, a doping well 120 and a doping region 130 are provided. The substrate 101 is usually a semiconductive material, such as Si and has a first conductivity type, such as a P type or an N type, for example P type. The substrate 101 further has a first side 105 and a second side 106 opposite to and parallel with the first side 105. The scribe line region 103 is one of the multiple regions (not shown) disposed on the substrate 101.

The epitaxial layer 110, the doping well 120 and the doping region 130 all are disposed on the first side 105 of the substrate 101. For example, the epitaxial layer 110 has the first conductivity type, for example N+ type, and is disposed on and in direct contact with the first side 105. The doping well 120 with a second conductivity type is disposed on and in direct contact with the epitaxial layer 110. The doping region 130 of the first conductivity type is disposed on the doping well 120. The second conductivity type may be a P-type or an N-type, for example P− type.

Figure 2:
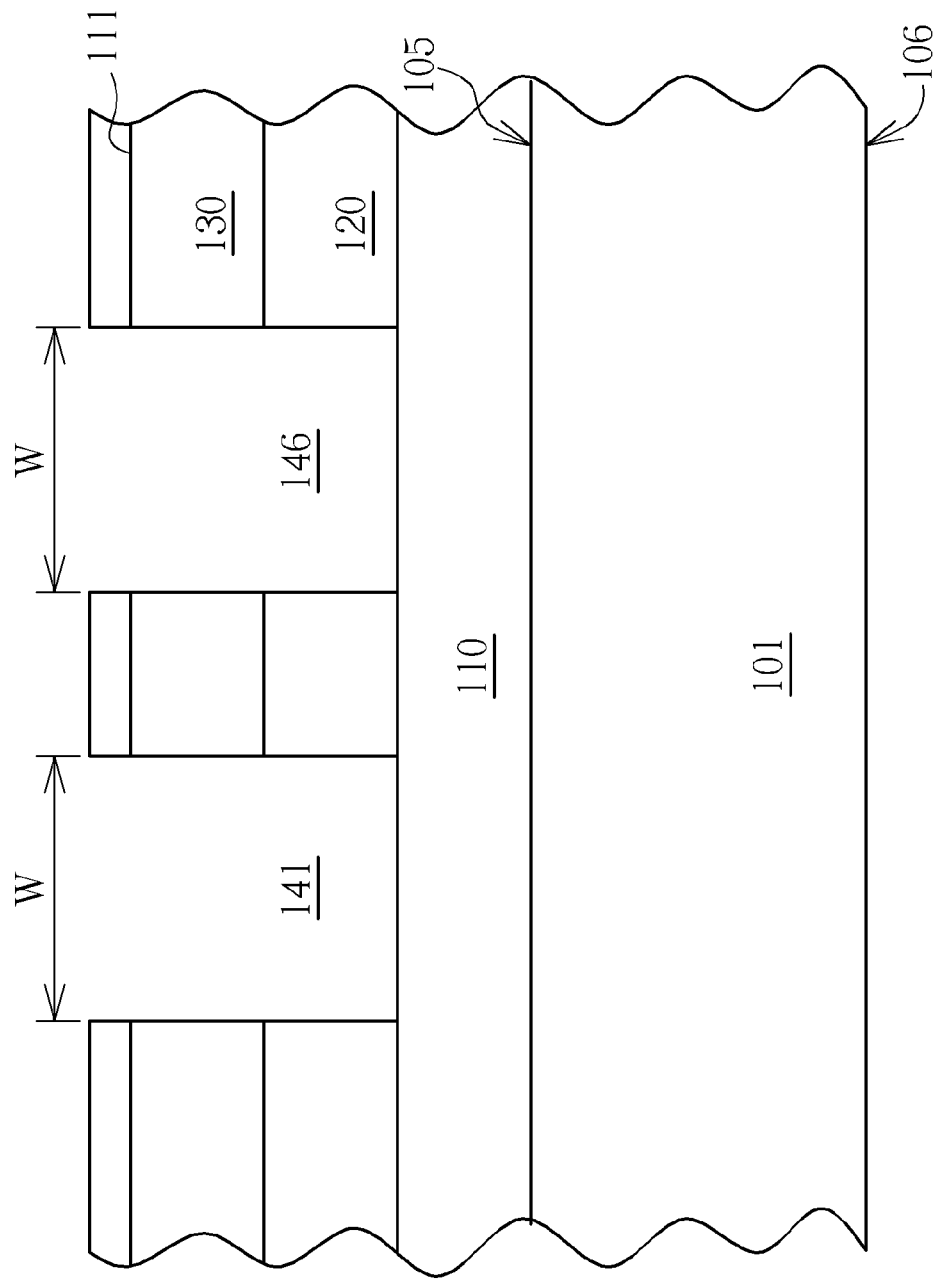

Second, as shown in FIG. 2, an etching step is carried out to form a gate trench 141 and a test via 146. The gate trench 141 and the test via 146 respectively penetrate the doping region 130 and the doping well 120. For example, the etching step may be a dry etching step and carried out in the presence of a patterned mask 111. The patterned mask 111 may be formed by conventional photolithography. In one embodiment of the present invention, the gate trench 141 and the test via 146 may have substantially the same width W. In another embodiment of the present invention, the gate trench 141 may have a first depth and the test via 146 may have a second depth after the etching step. The patterned mask 111 may be removed after the etching step is complete.

Figure 3:
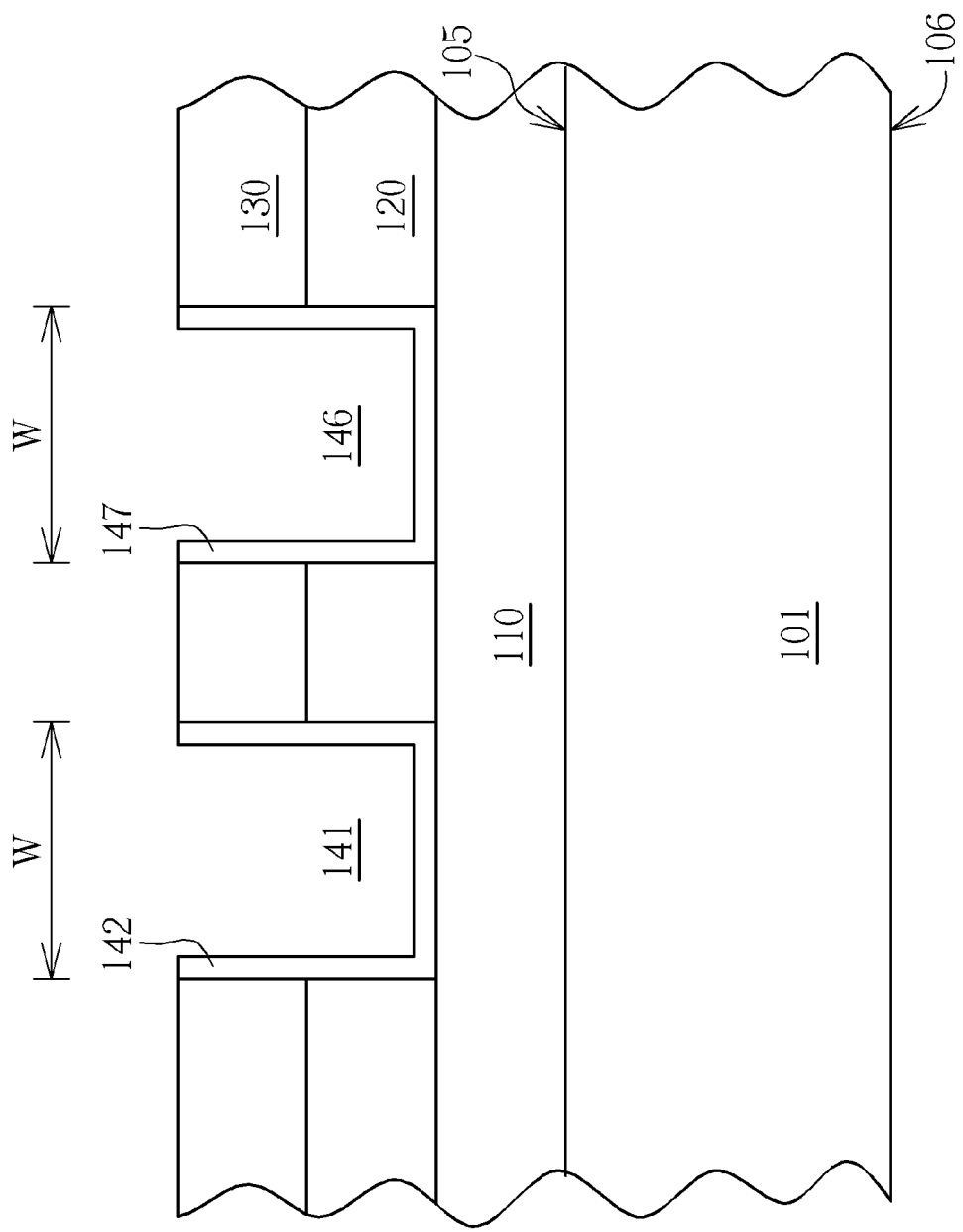

Later, as shown in FIG. 3, an oxidizing step is carried out. The oxidizing step may simultaneously form a gate isolation 142 which covers the inner wall of the gate trench 141 and also form an isolation 147 which covers the inner wall of the test via 146. The oxidizing step may be a dry oxidation. The gate isolation 142 may have a thickness around 50 nm and the isolation 147 may have a thickness around 50 nm.

Figure 4:
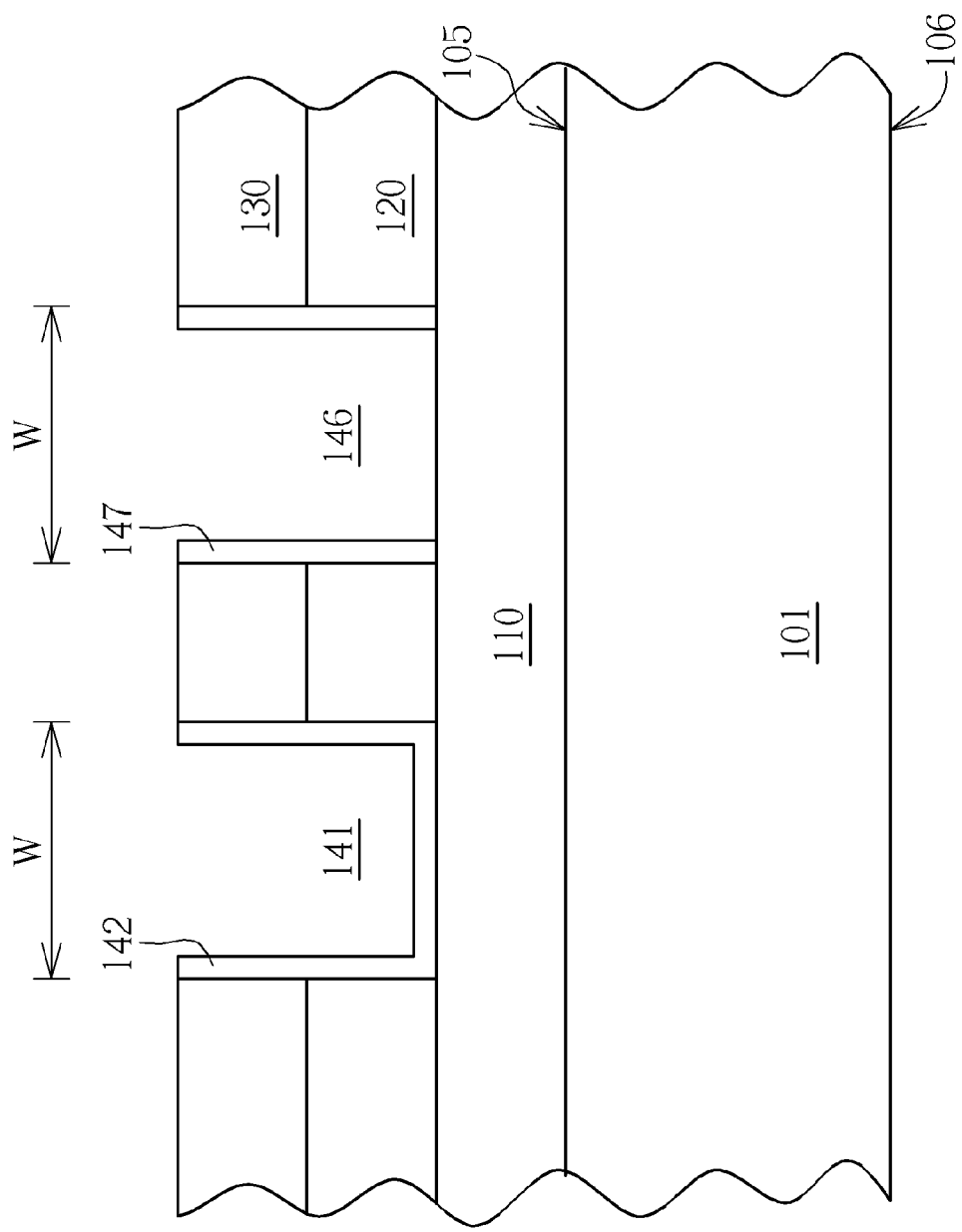

Then, as shown in FIG. 4, a back-etching step is carried out. The back-etching step is used to exclusively remove only some of the isolation 147 which covers the inner wall of the test via 146. Once the isolation 147 at the bottom of the inner wall of the test via 146 is removed, the underlying doping well 120 or the epitaxial layer 110 is again exposed. The back-etching step may be a break through etching step. After the back-etching step, the second depth is greater than the first depth.

Figure 5:
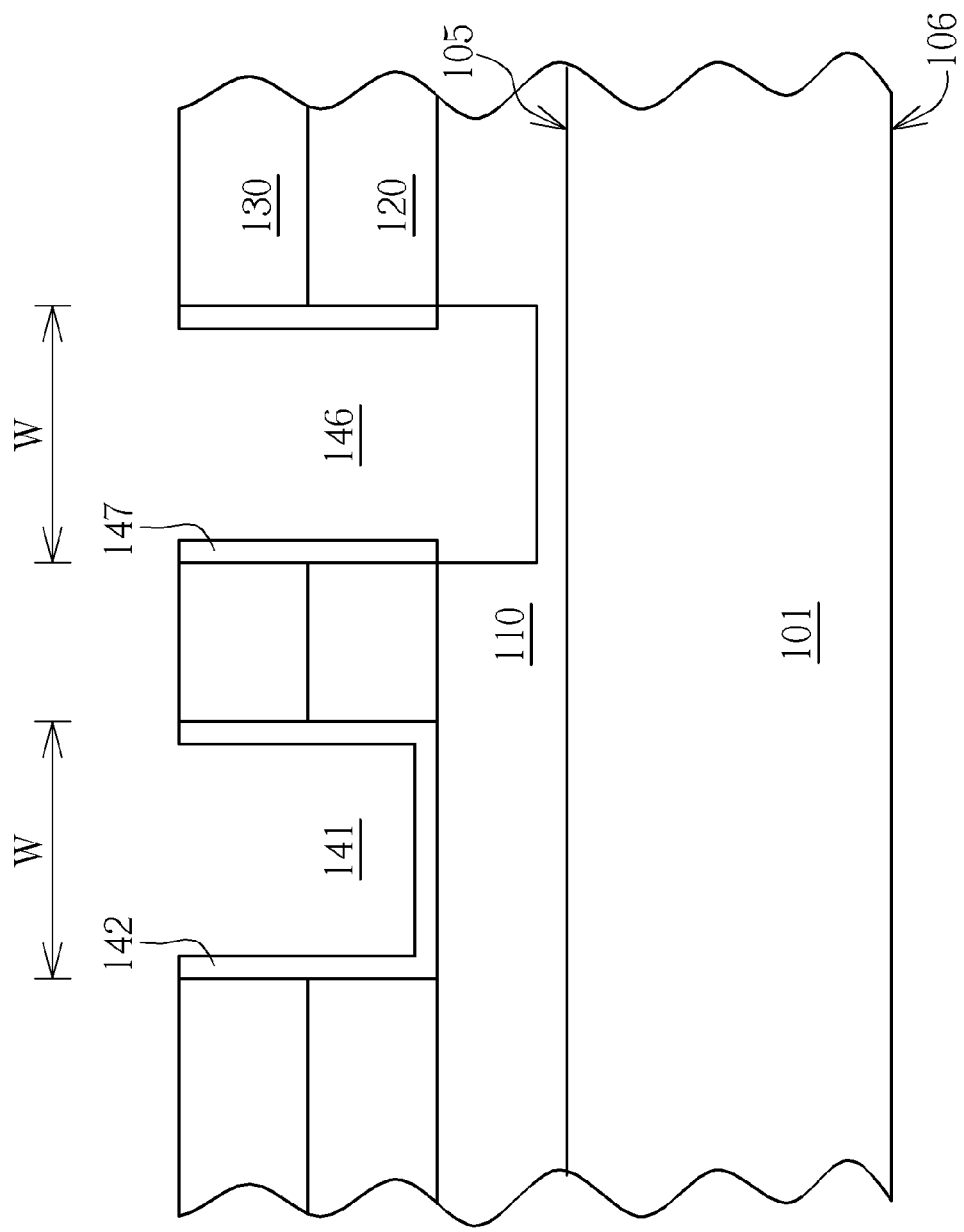

Next, as shown in FIG. 5, a penetrating step is carried out. The penetrating step is used to remove the underlying doping well 120 at the bottom of the test via 146 and make the test via 146 go deeper to penetrate into the epitaxial layer 110. Once the penetrating step is complete, the test via 146 is supposed to expose deep inside the epitaxial layer 110 disposed beneath the doping region 130 and the doping well 120. The penetrating step may be a high selectivity between Si and oxide etching step. After the penetrating step, the second depth is greater than the first depth.

Figure 6:
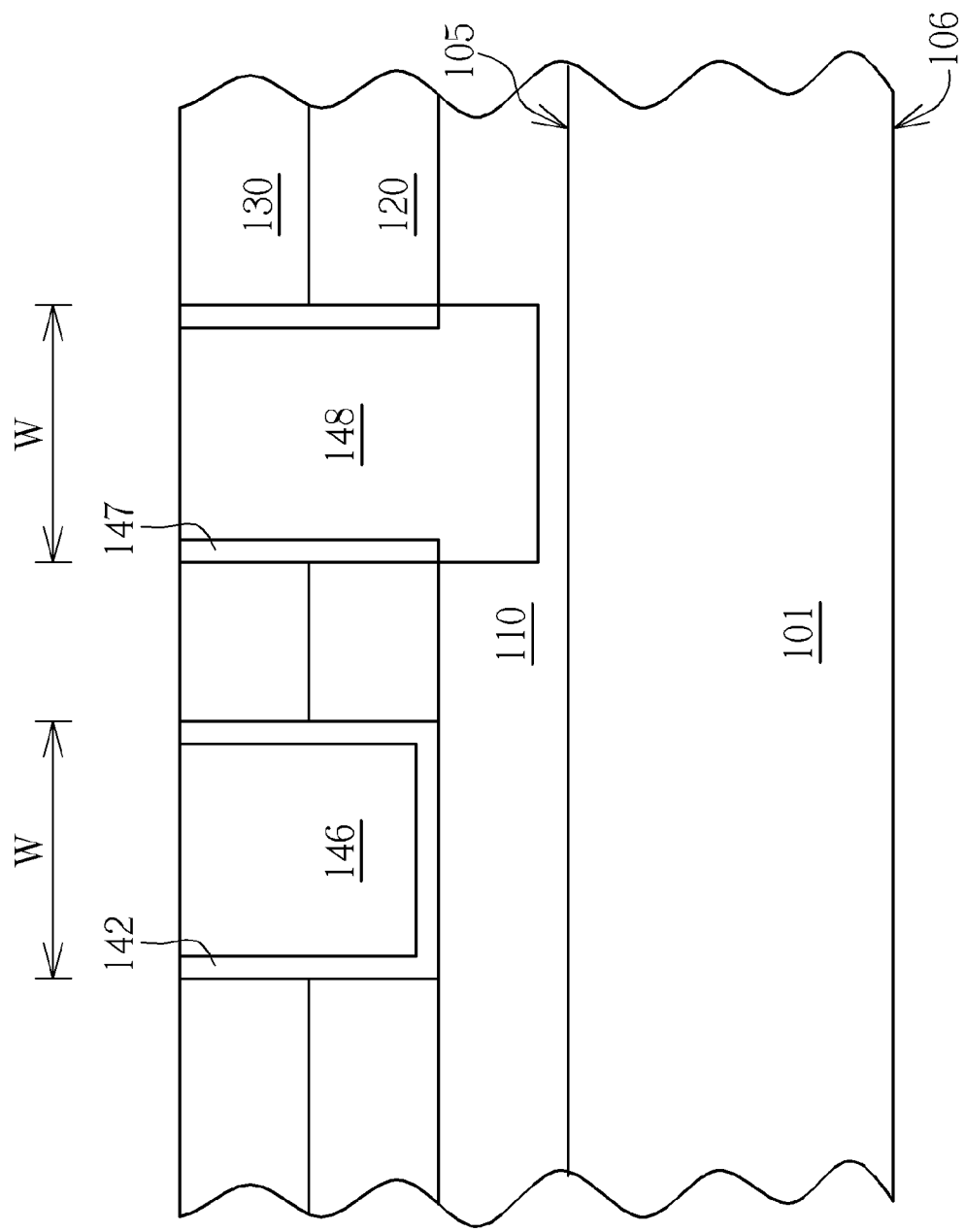
FIG. 6 illustrates a MOS test structure of the present invention.

Afterwards, as shown in FIG. 6, the test via 146 and the gate trench 141 are filled with a conductive material 148, such as doped Si. Once the test via 146 and the gate trench 141 are filled with the conductive material 148, the gate trench 141 becomes a trench gate 143 and the test via 146 becomes a test structure 149. In the presence of the electrical isolation 147 of the test via 146, the test structure 149 is capable of exclusively contacting and electrically connecting the substrate 101 and epitaxial layer 110 together which are disposed beneath the doping region 130 and the doping well 120 without the possible interference of the adjacent doping region 130 and doping well 120.

After the above steps, a MOS test structure 100 is provided in FIG. 6. The MOS test structure 100 of the present invention includes at least a substrate 101, a scribe line region 103, an epitaxial layer 110, a doping well 120, a doping region 130, a trench gate 143, a test via 146, an isolation 147 and a conductive material 148. The substrate 101 is usually a semiconductive material, such as Si and of a first conductivity type, such as a P-type or an N-type, for example P type. The substrate 101 further has a first side 105 and a second side 106 opposite to and parallel with the first side 105. The scribe line region 103 is one of the multiple regions (not shown) on the substrate 101. The epitaxial layer 110 has the first conductivity type, for example N+ type, and is disposed on and in direct contact with the first side 105. Preferably, the epitaxial layer 110 completely covers the substrate 101.

In one aspect, the doping well 120 with a second conductivity type is disposed on and in direct contact with the epitaxial layer 110. The second conductivity type may be a P-type or an N-type, for example P− type. Preferably, the doping well 120 completely covers the epitaxial layer 110. In another aspect, the doping region 130 has the first conductivity type, for example N+ type, and is disposed on the doping well 120. Preferably, the doping region 130 completely covers the doping well 120.

In one aspect, the trench gate 143 has a first depth and is disposed in the doping region 130, in the doping well 120 and in the scribe line region 103. The conductive material 148 fills a gate trench 141 which forms the trench gate 143. The conductive material 148 may include doped Si. In one embodiment of the present invention, the gate trench 141 and the test via 146 may substantially have the same width. In another aspect, the test via 146 has a second depth and the conductive material 148 also fills the test via 146. The test via 146 is disposed in the doping region 130, in the doping well 120, in the epitaxial layer 110 and in the scribe line region 103. In addition, there is an isolation 147 covering an inner wall of the test via 146. One feature of the present invention resides in that the second depth is greater than the first depth.

Another feature of the present invention lies in that the conductive material 148 which fills the test via 146 electrically connects to the epitaxial layer 110 while insulated from the adjacent doping region 130 and doping well 120 so that the test via 146 is capable of electrically communicating with the epitaxial layer 110 and the substrate 101 together under the protection of the isolation 147 without the possible interference of the adjacent doping region 130 and doping well 120.

The MOS test structure 100 of the present invention may be used for carrying out a wafer acceptance test (WAT). The wafer acceptance test (WAT) is capable of exclusively testing the substrate 101 and the epitaxial layer 110 in the scribe line region 103 disposed deeply under the doping region 130 and doping well 120 in spite of the presence of the doping region 130 and doping well 120.

First, as shown in FIG. 6, a MOS test structure 100 is provided. The MOS test structure 100 of the present invention includes at least a substrate 101, a scribe line region 103, an epitaxial layer 110, a doping well 120, a doping region 130, a trench gate 143, a test via 146, an isolation 147 and a conductive material 148. Please refer to the above descriptions for the details of the MOS test structure 100 of the present invention.

Figure 7:
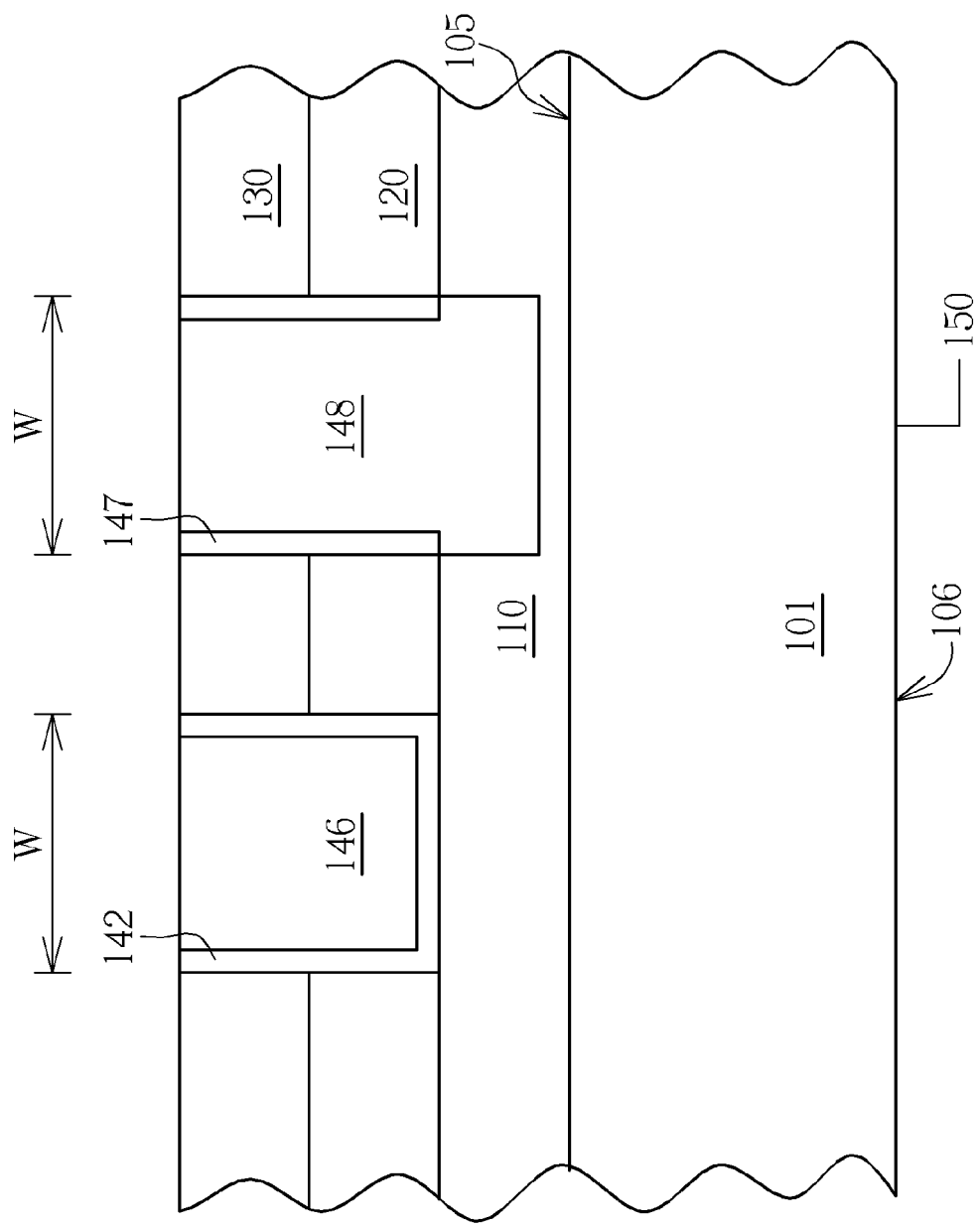
FIGS. 7-8 illustrate a method for performing a wafer acceptance test (WAT) of the present invention.

Second, as shown in FIG. 7, a signal 150 is applied on the second side 106. The signal 150 is usually an electric signal, such as a voltage or a current.

Figure 8:
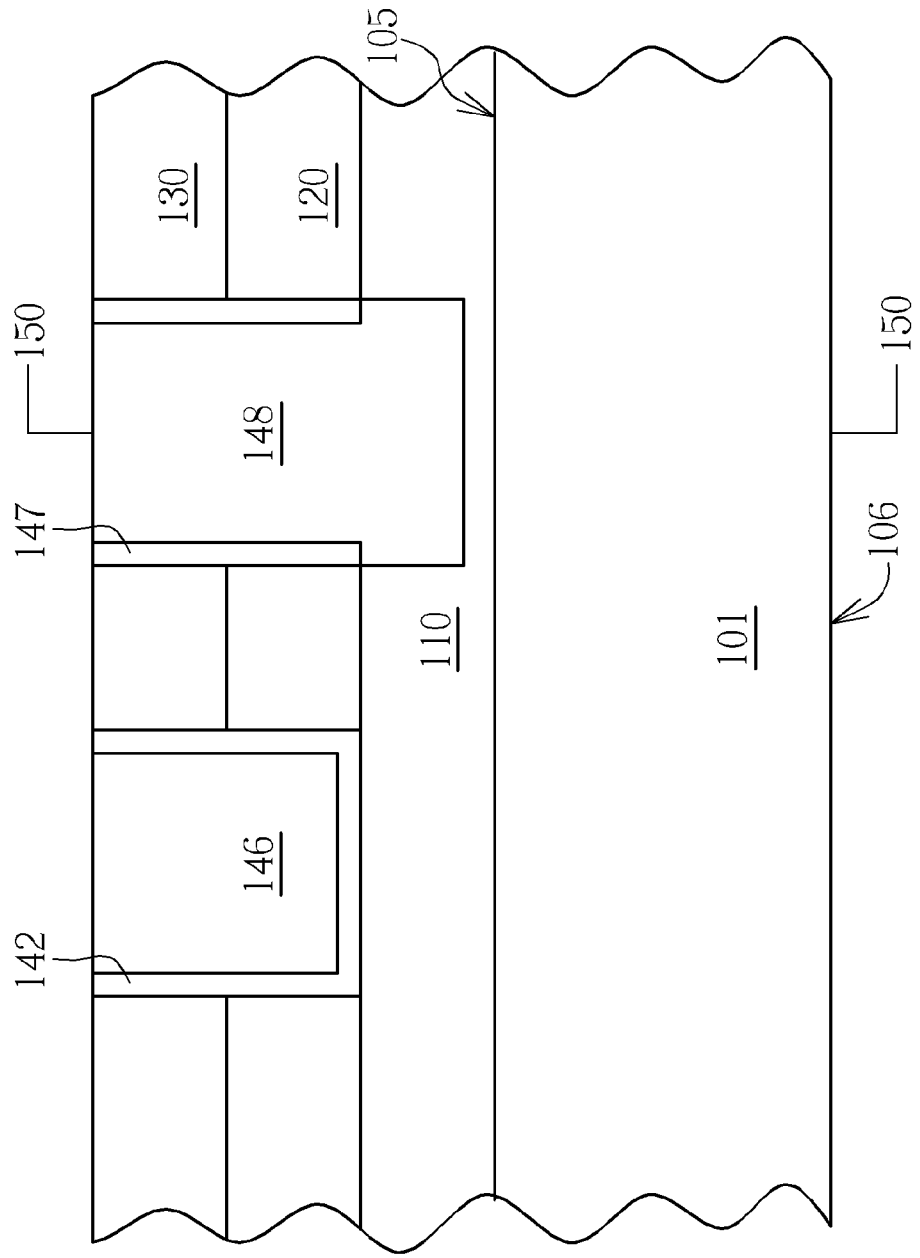

Then, as shown in FIG. 8, the signal 150 is measured from the conductive material 148 filling the test via 146. Since both of the doping region 130 and doping well 120 are electrically isolated from the conductive material 148 in the presence of the isolation 147, the wafer acceptance test (WAT) is capable of exclusively picking up the signal 150 traveling from the substrate 101 to the epitaxial layer 110 and testing the MOS test structure 100 without the influence of the doping region and the doping well.

Those skilled in the art will readily observe that numerous modifications and alterations of the device and method may be made while retaining the teachings of the invention.

What is claimed is:

1. A MOS test structure, comprising:
    a substrate of a first conductivity type and with a first side and a second side opposite to said first side;
    a scribe line region on said substrate;
    an epitaxial layer of said first conductivity type disposed on said first side;
    a doping well of a second conductivity type disposed on said epitaxial layer;
    a doping region of said first conductivity type disposed on said doping well;
    a trench gate of a first depth, disposed in said doping region, in said doping well and in said scribe line region; and
    a test via of a second depth and disposed in said doping region, in said doping well, in said epitaxial layer and in said scribe line region;
    an isolation covering an inner wall of said test via; and
    a conductive material filling said test via and electrically connected to said epitaxial layer so that said test via is capable of testing said epitaxial layer and said substrate together independent of the influence of an adjacent doping region and the doping well.

2. The MOS test structure of claim 1, wherein said epitaxial layer completely covers said substrate.

3. The MOS test structure of claim 1, wherein said doping well completely covers said epitaxial layer.

4. The MOS test structure of claim 1, wherein said doping region completely covers said doping well.

5. The MOS test structure of claim 1, wherein said first conductivity type is N type.

6. The MOS test structure of claim 1, wherein said first conductivity type is P type.

7. The MOS test structure of claim 1, wherein said trench gate and said test via have substantially the same width.

8. The trench MOS structure of claim 1, wherein said second depth is greater than said first depth.

9. The trench MOS structure of claim 1, wherein said conductive material is doped polysilicon.

10. A method for performing a wafer acceptance test (WAT), comprising:
    providing a MOS test structure, comprising:
        a substrate of a first conductivity type and with a first side and a second side opposite to said first side;
        a scribe line region on said substrate;
        an epitaxial layer of said first conductivity type disposed on said first side;
        a doping well of a second conductivity type disposed on said epitaxial layer;
        a doping region of said first conductivity type disposed on said doping well;
        a trench gate of a first depth, disposed in said doping region, in said doping well and in said scribe line region; and
        a test via of a second depth and disposed in said doping region, in said doping well, in said epitaxial layer and in said scribe line region;
        an isolation covering an inner wall of said test via; and
        a conductive material filling said test via and electrically connected to said epitaxial layer;
    applying a signal on said second side;
    measuring said signal from said conductive material filling said test via in the absence of the influence of said doping region and said doping well.

11. The method for performing a wafer acceptance test (WAT) of claim 10, wherein said first conductivity type is N type.

12. The method for performing a wafer acceptance test (WAT) of claim 10, wherein said first conductivity type is P type.

13. The method for performing a wafer acceptance test (WAT) of claim 10, wherein said signal is an electric signal.

14. The method for performing a wafer acceptance test (WAT) of claim 10, wherein said trench gate and said test via have substantially a same width.

15. The method for performing a wafer acceptance test (WAT) of claim 10, wherein said second depth is greater than said first depth.

* * * * *